(12) United States Patent  
Yoo

(10) Patent No.: US 6,240,014 B1  
(45) Date of Patent: May 29, 2001

(54) SEMICONDUCTOR MEMORY DEVICE

(75) Inventor: Tae-Hwa Yoo, Pyoungtaek (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/593,252

(22) Filed: Jun. 13, 2000

(30) Foreign Application Priority Data

Jun. 22, 1999 (KR) .................................................. 99-23428

(51) Int. Cl.[7] .................................................. G11C 16/06
(52) U.S. Cl. ............................... 365/185.09; 365/185.03; 365/185.22; 365/201
(58) Field of Search .................. 365/185.09, 185.03, 365/185.23, 201, 185.22

(56) References Cited

U.S. PATENT DOCUMENTS 5,155,701 * 10/1992 Komori et al. .................. 365/201 X
5,825,700 * 10/1998 Roohparvar ..................... 365/185.09

* cited by examiner

*Primary Examiner*—Huan Hoang
(74) *Attorney, Agent, or Firm*—Marger Johnson & McCollom, P.C.

(57) ABSTRACT

A semiconductor memory device includes a memory cell array, a word line voltage generation circuit, a row decoder, a first switching circuit, and a second switching circuit. The first switching circuit is coupled to an output terminal of the word line voltage generation circuit, and supplies an external test voltage to the word line voltage output terminal. The second switching circuit is coupled between the first switching circuit and the word line voltage output terminal, and interrupts a current path from the word line voltage output terminal to the first switching circuit when a voltage level of the word line voltage output terminal is higher than that of a power supply voltage.

17 Claims, 4 Drawing Sheets

SEMICONDUCTOR MEMORY DEVICE

This application relies for priority upon Korean Patent Application No. 1999-23428, filed on Jun. 22, 1999, the contents of which are herein incorporated by reference in their entirety.

FIELD OF THE INVENTION

The present invention relates to a semiconductor memory device and, more particularly, to a non-volatile semiconductor memory device with a multi-bit memory cell array.

BACKGROUND OF THE INVENTION

A conventional non-volatile memory cell includes a first terminal or a floating gate having high impedance and a second terminal or a MOS transistor having a control gate. Current electric memory circuits include thousands of cells that are integrated, with high packing rates, into a matrix shape in a semiconductor.

Because cells of a memory cell array are operated separately, each of the cells of a non-volatile memory chip needs to be able to receive programming or erasing signals. All of the cells are consequently required to have characteristics that lie within program operation and erasure operation minimum voltage margins. Different cells, however, have different threshold voltages for programming and erasing operations.

The ability to measure the distribution of threshold voltages (Vth) of (programmed and erased) memory cells is therefore very important to the fabricators and designers of memory devices. The density of threshold voltage distribution is a yardstick for determining whether memory arrangements are acceptable and whether state machines will smoothly perform their functions. To test the threshold voltage (Vth) of a memory cell, the gate voltage of a memory cell is supplied with a test voltage from the outside. In a memory circuit, the test voltage externally supplied to a cell terminal may be a program voltage.

FIG. 1 is a block diagram of a semiconductor memory device having a switching circuit 40 for testing the threshold voltage of a memory cell 20. As shown in FIG. 1, a semiconductor memory device includes a test pad 10, a memory cell array 20, a row decoder 30, a switching circuit 40, and a word line voltage generation circuit 50. The switching circuit 40 includes a PMOS transistor PM1, an NMOS transistor NM1, and an inverter INV1. During a test mode (when a test signal TE transitions to a high level), a test voltage from a test pad 10 is transferred to an output terminal 1. The test voltage is supplied to a gate of a selected cell 20 through a row decoder 30 (via a word line VwL). When the test voltage causes the gate of the selected cell 20 to start turning on, then that test (gate) voltage is the threshold voltage (Vth) of the selected memory cell 20.

When a test signal TE, applied to the word line voltage generation circuit 50, is disabled to a low level (i.e., during a program verify mode), a word line voltage is supplied to a word line voltage output terminal 1 from the word line voltage generation circuit 50. The word line voltage is then transferred to a selected word line through a row decoder 30. During a program mode (or read mode), the row decoder 30 receives a program voltage Vpgrn (or read voltage Vread) from a program (or read) voltage generation circuit (not shown). The row decoder 30 then transfers the program voltage Vpgm (or read voltage Vread) to the selected word line 1, while transferring a pass voltage Vpass to non-selected word lines.

FIG. 2 shows switching circuit 40 schematically and in a cross-sectional view. Referring now to FIGS. 1 and 2, the PMOS transistor PM1 and the NMOS transistor NM1 of the switching circuit 40 are formed as an N-well 62 and a P-well 64, respectively, in a P-type substrate 60. The N-well 62 is coupled to a low power supply voltage Vcc (e.g., 2.1V or less), and the P-well is coupled to a ground GND.

In the switching circuit 40 of a memory device having multi-bit memory cells 20, when a test signal TE is disabled (for example, during a program verify mode), a voltage of 0.4V, 1.6V, or 2.8V is supplied to the selected word line in a state of "10", "01", or "00", respectively. A voltage of 0.8V–1.0V, on the other hand, is supplied to a word line of a single-bit memory cell during program verify operation.

In operation, when the test signal TE is disabled, the PMOS transistor PM1 and the NMOS transistor NM1 of the switching circuit 40 are turned off. A voltage (2.2V in a state of "00") is supplied to the output terminal 1 of a word line voltage generation circuit 50, and a low power supply voltage of about 2.1V or less is supplied to the N-well 62. A PN diode D1 is consequently turned on between a source 66b (connected to $V_{WL}$) and the well 62 of the PMOS transistor coupled to the word line voltage output terminal 1, so that leakage current flows. This leakage current makes it impossible to verify a normal program operation under these conditions.

SUMMARY OF THE INVENTION

The present invention solves the problem of leakage current by providing a memory device capable of interrupting the leakage current path between the switching circuit and the word line output terminal during a normal operation mode.

According to one aspect of the invention, a semiconductor memory device includes a memory cell array, a row decoder, a first switching circuit, and a second switching circuit. The memory cell array has a plurality of memory cells, each coupled to a word line among a plurality of word lines. During a normal operation mode, a word line voltage generation circuit generates a word line voltage. The row decoder selects one of the word lines and supplies the word line voltage to the selected word line. The first switching circuit is coupled to a test pad, and supplies an external test voltage to the word line voltage output terminal. The second switching circuit is coupled between the first switching circuit and the word line voltage output terminal and is configured such that, if a voltage level of a word line voltage terminal is higher than that of a power supply voltage, it interrupts the current path from the word line voltage output terminal to the first switching circuit.

In a preferred embodiment, the normal operation mode is a program verify mode and each of the memory cells is a multi-bit memory cell. The second switching circuit, according to this embodiment, includes a depletion-type transistor having a gate that receives the test signal and a channel coupled between the first switching circuit and the word line voltage output terminal. When a signal informing the test mode is enabled, the second switching circuit supplies a test voltage to the word line voltage output terminal. When the signal is disabled, an output terminal voltage of the word line voltage generation circuit is higher than a power supply voltage causing the second switching circuit to interrupt the coupling between the word line voltage output terminal and the first switching circuit.

According to another embodiment of this invention, a semiconductor memory device has a plurality of word lines, a memory cell array, a row decoder, a switching circuit, and a word line voltage generation circuit. The memory cell array includes a plurality of memory cells, each coupled to one of the word lines. The row decoder selects one of the word lines and the switching circuit supplies an external test voltage to the selected word line through the row decoder in response to a first and a second test signals. The word line voltage generation circuit supplies a voltage to the selected word line through the row decoder during a program verify mode. The switching circuit includes a first transistor, a second transistor, and a third transistor. The first transistor has a gate that receives the second test signal, and a source/drain formed at a second conductive well in a first conductive substrate. The second transistor has a gate that receives the first test signal, and a source/drain formed in a first conductive well at a distance from the second conductive well. The third transistor has a gate that receives the first test signal and a source/drain formed on the substrate. The sources of the first, second, and third transistors are interconnected. The drains of the first and the second transistors are coupled to a test pad, and the drain of the third transistor is coupled to an output terminal of the word line voltage generation circuit.

In this embodiment, the third transistor supplies a test voltage to an output terminal of a word line voltage generation circuit when the first test signal is enabled, and interrupts a current path from the output terminal of the word line voltage generation circuit to the first transistor when the first test signal is disabled.

According to a still further embodiment of the invention, a semiconductor memory device includes a test pad, a multi-bit memory cell array, a word line voltage generation circuit, a row decoder, and a switching circuit. The test pad receives an external voltage. The memory cell array has a plurality of multi-bit memory cells, each coupled to a word line among a plurality of word lines. The word line voltage generation circuit supplies a word line voltage to the word line voltage output terminal during a program verify mode. The row decoder selects one of the word lines and supplies a voltage to the selected word line. The switching circuit is coupled between the test pad and the word line voltage output terminal of the word line voltage generation circuit and supplies a test voltage to the word line voltage output terminal during a test mode.

An interruption circuit is also included and is coupled between the switching circuit and a word line voltage output terminal of the word line voltage generation circuit. The interruption circuit interrupts a leakage current path from the output terminal of the word line voltage generation circuit to the switching circuit during the program verify mode when the word line voltage is higher than a power supply voltage. Specifically, the interruption circuit preferably includes a depletion-type transistor that is coupled between a word line voltage terminal and the switching circuit. As a result, it is possible to interrupt a leakage current path from the word line voltage output terminal to the first switching circuit even though a word line voltage is higher than a power supply voltage.

BRIEF DESCRIPTION OF THE DRAWINGS

A greater understanding of the features and advantages of the present invention may be realized by the following detailed description of preferred embodiments made with reference to the accompanying drawings, in which.

DETAILED DESCRIPTION OF THE PREFERRED EMBODIMENTS

Figure 1:
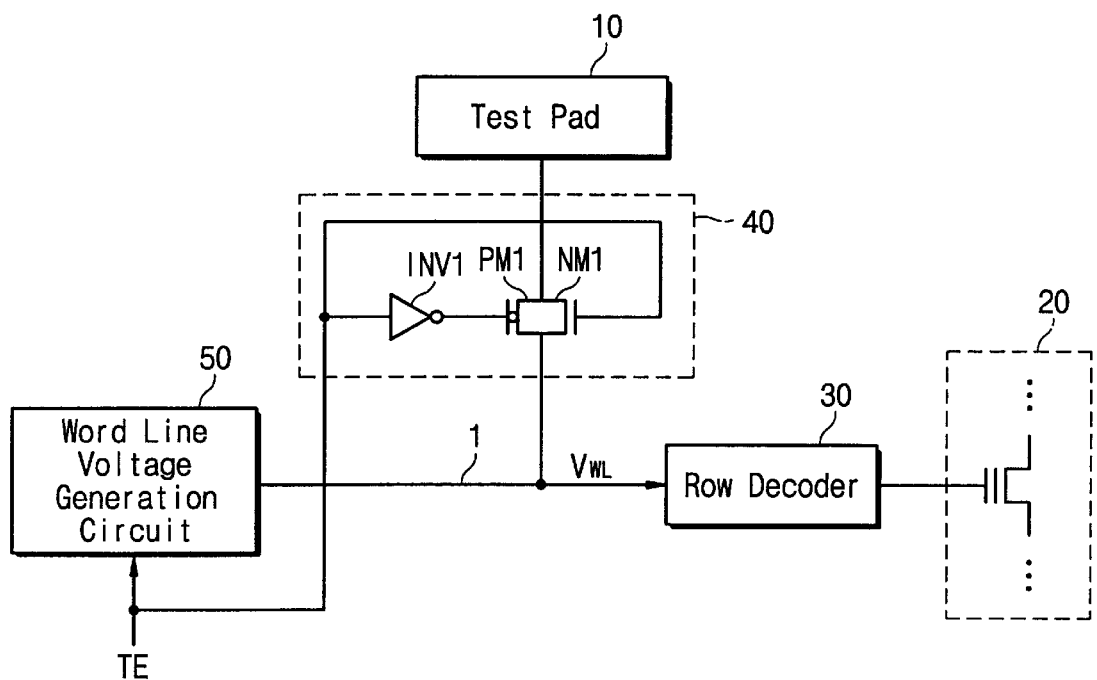
FIG. 1 is a schematic block diagram showing a semiconductor memory device in accordance with the prior art.
Figure 2:
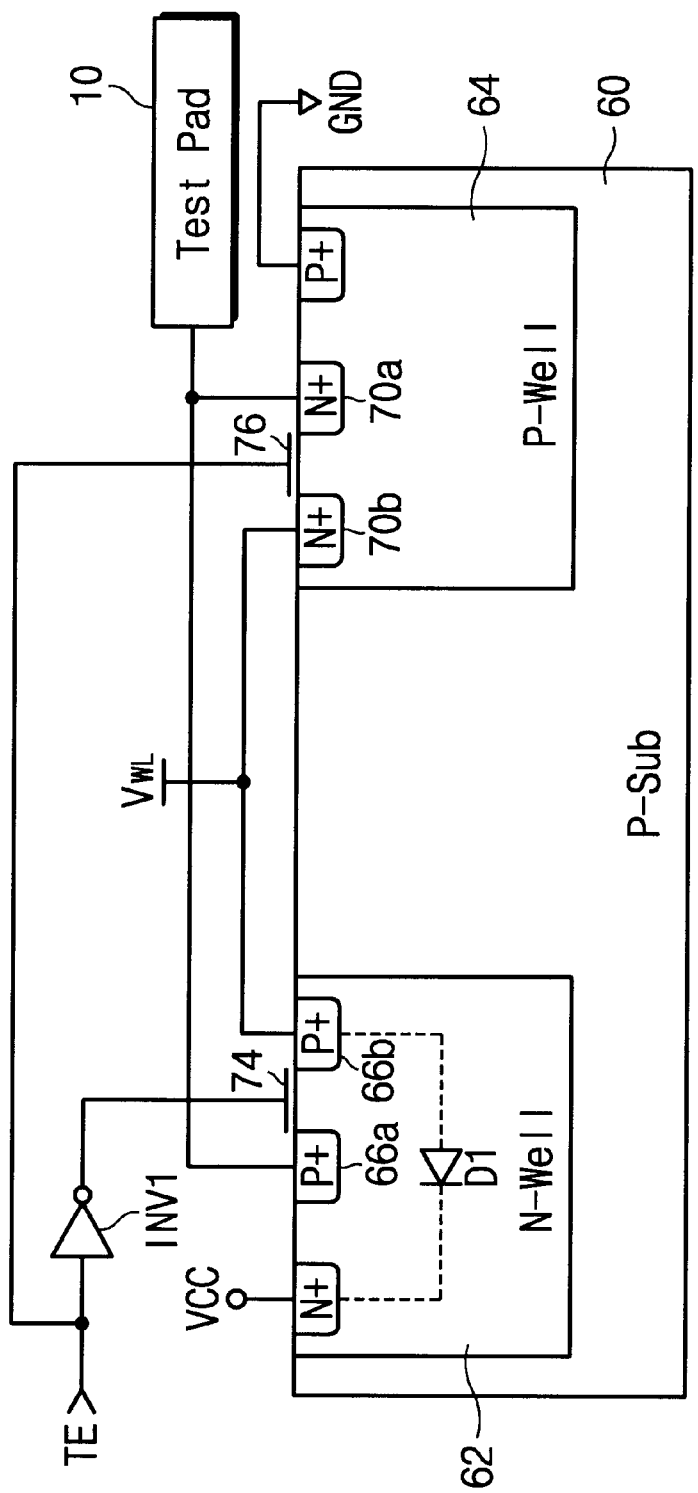
FIG. 2 is a schematic cross-sectional diagram of the prior art semiconductor memory device of FIG. 1.
Figure 3:
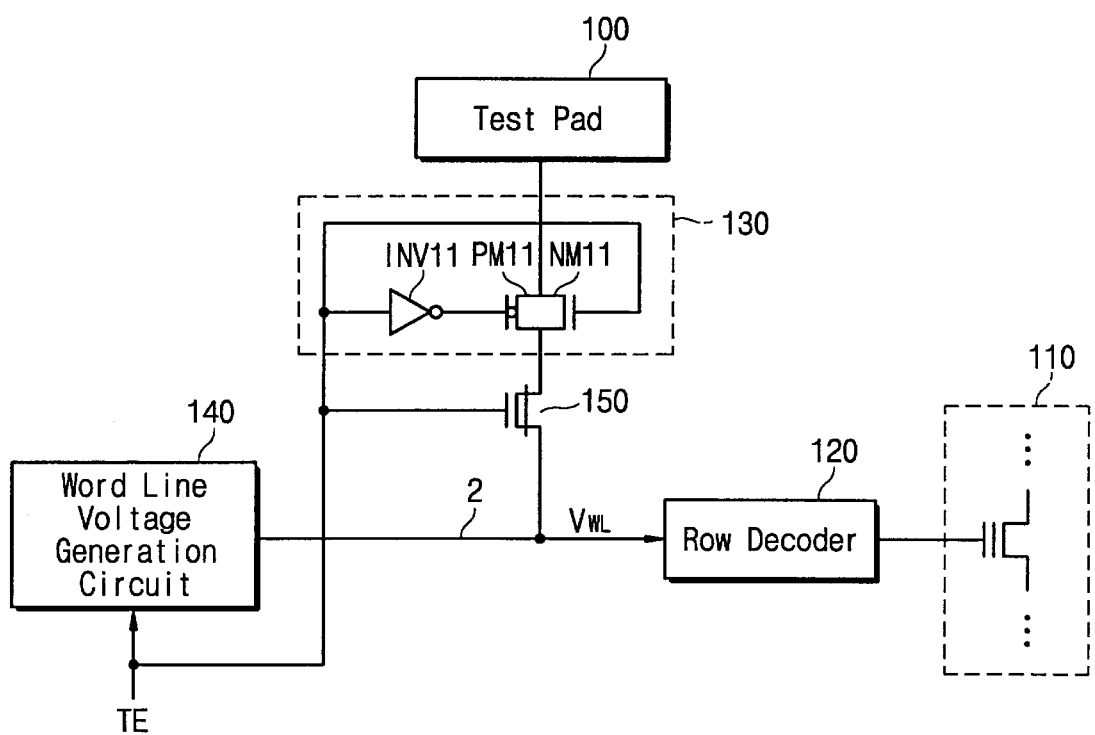
FIG. 3 is a schematic block diagram showing a semiconductor memory device in accordance with a preferred embodiment of the invention.

Referring to FIG. 3, a semiconductor memory device, according to a first preferred embodiment of this invention, includes a test pad 100, a memory cell array 110, a row decoder 120, a first switching circuit 130, a word line voltage generation circuit 140, and a second switching circuit 150. The memory cell array 110 includes a plurality of multi-bit memory cells, each having a floating gate and a control gate. A plurality of word lines are also provided, each of which is connected to the control gate of one of the memory cells. The first switching circuit 130 is coupled between the test pad 100 and the second switching circuit 150. The second switching circuit 150 is coupled between the first switching circuit 130 and the word line voltage output terminal 2.

The first switching circuit 130 includes an inverter INV11, a PMOS transistor PM11, and an NMOS transistor NM11. The inverter INV11 has an input terminal that receives the test signal TE and an output terminal that outputs an inverted version of the test signal. The PMOS transistor PM11 has a gate coupled to the output terminal of the inverter INV11 and a channel coupled, at one end, to the test pad 100 and, at the other end, to the word line voltage output terminal 2 through the second switching circuit 150. The NMOS transistor NM11 has a gate coupled to the input terminal of the inverter INV11 and a channel formed in parallel with the channel of the PMOS transistor. The second switching circuit 150 is an NMOS depletion-type transistor that has a gate connected to receive the test signal TE and a channel formed between the first switching circuit 130 and the word line voltage output terminal 2.

In operation, the row decoder 120 selects one of the word lines and the word line voltage generation circuit 130 supplies a word line voltage to a word line voltage output terminal 2 in response to a test signal TE (whereby the second switching circuit 150 is on). The first switching circuit 130 supplies an external test voltage to the word line voltage output terminal 2 through the second switching circuit 150 in response to a test signal TE informing a test mode. When a voltage of the word line voltage output terminal 2 is higher than the power supply voltage, the second switching circuit 150 prevents a word line voltage VWL from being transferred to the first switching circuit 130, as will be explained below.

Figure 4:
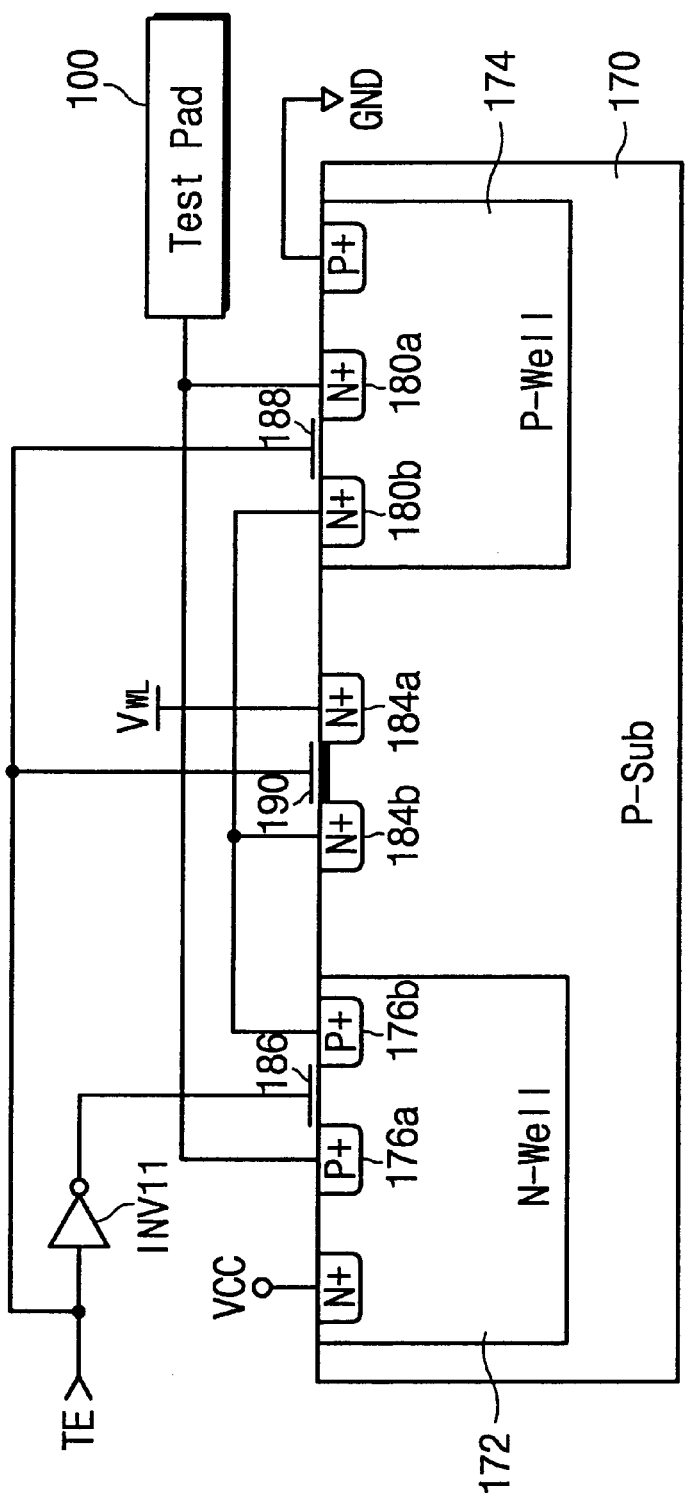
FIG. 4 is a schematic cross-sectional diagram of the semiconductor memory device of FIG. 3.

FIG. 4 is a cross-sectional view of the memory device of FIG. 3, showing transistors of a first switching circuit 130 and a second switching circuit 150. Referring to FIGS. 3 and 4, an N-well 172 is formed in a P-type substrate 170 and a P-well 174 is formed apart from the N-well 172. The N-well 172 is coupled to a power supply voltage Vcc, and a P-well 174 is coupled to a ground GND. A source/drain region of the PMOS transistor PM11 of the first switching circuit 130 is formed in the N-well 172 as P$^+$impurity regions 176a and 176b. A drain/source region of the NMOS transistor NM11 of the first switching circuit 130 is formed in the P-well 174 as N$^+$impurity regions 180a and 180b.

Drain/source regions 184a and 184b and a channel 190 of the depletion-type transistor of the second switching circuit 150 are formed between the N-well and the P-well of the substrate. Gate 188 of the NMOS transistor NM11 receives the test signal TE, while gate 186 of the PMOS transistor PM11 receives an inverted version of the test signal TE via inverter INV11. Drains 176a and 180a of the PMOS and NMOS transistors PM11 and NM11, respectively, are coupled in common to the test pad 100. Sources 176b and 180b of the PMOS and NMOS transistors are connected together. A gate 190 of the depletion-type transistor of the second switching circuit 150 receives a test signal TE, while a drain 184a thereof is coupled to the word line voltage $V_{WL}$, and a source 184b thereof is connected to the sources 176b and 180b of the PMOS transistor and the NMOS transistor, respectively.

Operation of a semiconductor memory device in accordance with the preferred embodiment of the invention during a test mode and a program verify mode will now be described with further reference to FIGS. 3 and 4. Specifically, when a test signal TE, informing a test mode, is enabled to a high level Vcc (e.g., 2.0V) an NMOS transistor NM11 and a depletion transistor 150 are turned on directly, and a PMOS transistor PM11 is turned on through an inverter INV11. A word line voltage generation circuit 140 is simultaneously disabled. If a threshold voltage of the depletion transistor 150 is −1.5V and a high level Vcc is 2.0V, a test voltage of maximum 3.5V is supplied to a word line voltage output terminal 2 until the depletion transistor 150 is shut off. A row decoder selects one of a plurality of word lines and supplies the test voltage from the word line voltage output terminal 2 to the selected word line. The row decoder 120 supplies a pass voltage Vpass to non-selected word lines.

When the test signal TE is disabled to a low level (GND, 0V) (i.e., during a program verify mode), the word line voltage generation circuit 120 is enabled, and the PMOS transistor PM11 and the NMOS transistor NM11 are turned off. A word line voltage generation circuit 140 consequently supplies a word line voltage VWL to the word line voltage output terminal 2 to verify a program voltage. For example, during verification of a cell programmed to a cell state of "00", the word line voltage generation circuit 140 supplies a word line voltage $V_{WL}$ of 2.8V to the output terminal 2. Since the test signal TE, with a ground level voltage GND, is applied to the gate of the depletion transistor 150, a voltage of 1.5V is charged to sources of the PMOS transistor PM11 and the NMOS transistor NM11 in common. That is, since a voltage (1.5V) lower than a well voltage (Vcc=2.1V) is charged to a source of the PMOS transistor PM11, a diode (which is not shown because it is effectively reversed biased) between a source 176b and a well 172 is turned off to prevent leakage current from flowing. The common connection between 176b, 184b, and 180b may be thought of as a clamp because it acts to clamp a voltage to reverse bias the diode between the source 176b and the well 172.

According to the invention, therefore, it is possible to interrupt leakage current from a word line voltage output terminal to a first switching circuit even when the word line voltage is higher than a power supply voltage in a low power voltage region. Although the invention has been described with reference to a few typical preferred embodiments, and, although specific terms have been used in the foregoing descriptions, all terms are used in their generic and descriptive sense only and should not be construed as limiting the scope of the invention beyond the limitations set forth in the following claims.

What is claimed is:

1. A semiconductor memory device comprising:
    a memory cell array comprising a plurality of memory cells, each memory cell coupled to one of a plurality of word lines;
    a word line voltage generation circuit configured to generate a word line voltage during a normal operation mode;
    a row decoder adapted to select one of the word lines and to supply the word line voltage to the selected word line;
    a first switching circuit configured to supply an external test voltage to a word line voltage output terminal during a test mode; and
    a second switching circuit, coupled between the first switching circuit and the word line voltage output terminal, said second switching circuit configured to interrupt a current path from the word line voltage output terminal to the first switching circuit during the normal operation mode.

2. A semiconductor memory device according to claim 1 wherein the normal operation mode is a program verify mode.

3. A semiconductor memory device according to claim 1 wherein each of the memory cells is a multi-bit cell.

4. A semiconductor memory device according to claim 1 wherein the second switching circuit is configured to supply a test voltage to the word line voltage output terminal when a signal informing the test mode is enabled; and
    wherein the second switching circuit is configured to interrupt a coupling between the word line voltage output terminal and the first switching circuit when the signal informing the test mode is disabled if an output terminal voltage of the word line voltage generation circuit is higher than a power supply voltage.

5. A semiconductor memory device according to claim 1 wherein the first switching circuit comprises:
    an inverter having an input terminal configured to receive a signal informing a test mode, and an output terminal;
    a PMOS transistor having a gate coupled to the output terminal of the inverter, and having a current path coupled between a test pad and the word line voltage output terminal; and
    an NMOS transistor having a gate coupled to the input terminal of the inverter, and a current path coupled between the test pad and the word line voltage output terminal.

6. A semiconductor memory device according to claim 1 wherein the second switching circuit is a depletion-type transistor having a gate configured to receive the external test voltage and a channel coupled between the first switching circuit and the word line voltage output terminal.

7. A semiconductor memory device according to claim 1 wherein the second switching circuit is configured to interrupt a current path from the word line voltage output terminal to the first switching circuit during a program verify mode.

8. A switching circuit in a semiconductor memory device, said switching circuit configured to supply an external test voltage to a selected word line in response to a first and a second test signals, wherein the switching circuit comprises:
    a first transistor having a gate configured to receive the second test signal, and a drain and a source formed at a second conductive well in a first conductive substrate;
    a second transistor having a gate configured to receive the first test signal, and a drain and a source formed in a first conductive well apart from the second conductive well; and a third transistor having a gate configured to receive the first test signal, and a drain and a source coupled to an output terminal of a word line voltage generation circuit, wherein the sources of the first, second and third transistors are interconnected, and wherein the drains of the first and the second transistors are coupled to a test pad.

9. A switching circuit according to claim 8 wherein the first conductive well is an N-well configured to receive a power supply voltage, and the second conductive well is a P-well configured to receive a ground voltage.

10. A switching circuit according to claim 8 wherein the third transistor is a depletion-type transistor.

11. A switching circuit according to claim 8 wherein the third transistor is configured to supply a test voltage to an output terminal of the word line voltage generation circuit when the first test signal is enabled; and wherein the third transistor is configured to interrupt a current path from the output terminal of the word line voltage generation circuit when the first test signal is disabled.

12. A semiconductor memory device comprising:

a test pad configured to receive an external voltage;

a memory cell array comprising a plurality of multi-bit memory cells, wherein each memory cell is connected to one of a plurality of word lines;

a word line voltage generation circuit configured to supply a word line voltage to a word line voltage output terminal during a program verify mode;

a row decoder configured to select one of the word lines and to supply a voltage to the selected word line;

a switching circuit, coupled between the test pad and the word line voltage output terminal of the word line voltage generation circuit, configured to supply a test voltage to the word line voltage output terminal during a test mode; and an interrupting circuit coupled between the switching circuit and the word line voltage output terminal of the word line voltage generation circuit, said interrupting circuit configured to interrupt a current path from the word line voltage output terminal to the switching circuit during the program verify mode when the word line voltage is higher than a power supply voltage.

13. A semiconductor memory device according to claim 12 wherein the switching circuit comprises:

an inverter configured to receive and invert a first test signal informing the test mode, said inverter having an input terminal configured to receive the first test signal and an output terminal configured to output an inverted first test signal as a second test signal; and a PMOS transistor having a gate coupled to the output terminal of the inverter, and a current path coupled between the test pad and a clamp; and an NMOS transistor having a gate coupled to the input terminal of the inverter, and a current path coupled between the test pad and a clamp.

14. A semiconductor memory device according to claim 12 wherein the interrupting circuit comprises an NMOS depletion-type transistor having a gate configured to receive the first test signal and a channel formed between the switching circuit and the word line voltage output terminal.

15. A second switching circuit for a semiconductor memory device, said second switching circuit coupled between a first switching circuit and a word line voltage output terminal, and comprising:

a gate configured to receive a test voltage; and a channel coupled between the first switching circuit and the word line voltage output terminal, wherein said second switching circuit is configured to interrupt a current path between the word line voltage output terminal and the first switching circuit during a program verify mode of the semiconductor memory device.

16. A second switching circuit according to claim 15, wherein the gate and channel are formed in a depletion-type transistor.

17. A second switching circuit according to claim 15, wherein the program verify mode is configured to cause a word line output voltage to be higher than a power supply voltage.

* * * * *

UNITED STATES PATENT AND TRADEMARK OFFICE
CERTIFICATE OF CORRECTION

PATENT NO. : 6,240,014 B1
DATED : May 29, 2001
INVENTOR(S) : Yoo

It is certified that error appears in the above-identified patent and that said Letters Patent is hereby corrected as shown below:

Column 1,
Line 51, "$V_WL$" should read -- $V_{WL}$ --.
Line 62, "Vpgrn" should read -- Vpgm --.

Column 4,
Line 52, "VWL" should read -- $V_{WL}$ --.

Column 5,
Line 39, "VWL" should read -- $V_{WL}$ --.

Signed and Sealed this

Seventh Day of May, 2002

Attest:

Attesting Officer

JAMES E. ROGAN
*Director of the United States Patent and Trademark Office*